United States Patent
Cheng et al.

(10) Patent No.: US 9,882,028 B2
(45) Date of Patent: Jan. 30, 2018

(54) PITCH SPLIT PATTERNING FOR SEMICONDUCTOR DEVICES

(71) Applicant: INTERNATIONAL BUSINESS MACHINES CORPORATION, Armonk, NY (US)

(72) Inventors: Kangguo Cheng, Schenectady, NY (US); Lawrence A. Clevenger, LaGrangeville, NY (US); Balasubramanian S. Pranatharthiharan, Watervliet, NY (US); John H. Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/196,386

(22) Filed: Jun. 29, 2016

(65) Prior Publication Data

US 2018/0006138 A1     Jan. 4, 2018

(51) Int. Cl.
| | |
|---|---|
| *H01L 21/311* | (2006.01) |
| *H01L 29/66* | (2006.01) |
| *H01L 21/3115* | (2006.01) |
| *H01L 21/02* | (2006.01) |
| *H01L 21/033* | (2006.01) |

(52) U.S. Cl.
CPC .. *H01L 29/66795* (2013.01); *H01L 21/02129* (2013.01); *H01L 21/0337* (2013.01); *H01L 21/0338* (2013.01); *H01L 21/3115* (2013.01); *H01L 21/31105* (2013.01); *H01L 29/66545* (2013.01)

(58) Field of Classification Search
CPC ........ H01L 21/033; H01L 21/84; H01L 29/66
USPC .................................................. 438/703, 158
See application file for complete search history.

(56) References Cited

U.S. PATENT DOCUMENTS

| | | | | |
|---|---|---|---|---|
| 5,328,810 A | * | 7/1994 | Lowrey ............... | H01L 21/0271 148/DIG. 106 |
| 6,063,688 A | * | 5/2000 | Doyle .................... | B82Y 10/00 257/E21.038 |
| 6,239,008 B1 | * | 5/2001 | Yu ....................... | H01L 21/0274 257/E21.027 |
| 6,734,107 B2 | | 5/2004 | Lai et al. | |

(Continued)

*Primary Examiner* — Caleb Henry
(74) *Attorney, Agent, or Firm* — Cantor Colburn LLP; Vazken Alexanian

(57) ABSTRACT

A method for forming fins of a semiconductor device comprises forming a first hardmask on a substrate, a sacrificial layer on the first hardmask, and a second hardmask on the sacrificial layer. Portions of the second hardmask and the sacrificial layer are removed to form a mandrel. Spacers are formed adjacent to the sacrificial mandrel. A second sacrificial layer is deposited and portions of the second sacrificial layer are removed to expose portions of the spacers and the first hardmask. A first doped region and a second doped region are formed by annealing. The second hardmask and the sacrificial spacer are removed. Undoped portions of the sacrificial mandrel and the second sacrificial layer are removed to further expose portions of the first hardmask. Exposed portions of the first hardmask are removed to expose portions of the semiconductor substrate, and exposed portions of the semiconductor substrate are removed to form fins.

20 Claims, 19 Drawing Sheets

(56) References Cited

U.S. PATENT DOCUMENTS

| | | | |
|---|---|---|---|
| 6,875,703 B1 | 4/2005 | Furukawa et al. | |
| 7,393,789 B2* | 7/2008 | Abatchev | H01L 21/0337 257/E21.206 |
| 7,432,120 B2 | 10/2008 | Mascolo et al. | |
| 7,560,390 B2 | 7/2009 | Sant et al. | |
| 7,662,299 B2 | 2/2010 | Subramanian et al. | |
| 7,696,101 B2 | 4/2010 | Li | |
| 7,759,197 B2* | 7/2010 | Tran | H01L 21/0337 257/E21.205 |
| 7,807,575 B2* | 10/2010 | Zhou | H01L 21/3088 257/797 |
| 7,884,022 B2* | 2/2011 | Bai | H01L 21/0337 257/E21.039 |
| 7,902,074 B2* | 3/2011 | Niroomand | H01L 21/0338 438/694 |
| 7,910,288 B2* | 3/2011 | Abatchev | H01L 21/0337 430/313 |
| 8,048,813 B2* | 11/2011 | Lai | H01L 21/0337 438/689 |
| 8,207,576 B2* | 6/2012 | Tran | H01L 21/0337 257/332 |
| 8,354,331 B2 | 1/2013 | Cheng et al. | |
| 8,518,836 B1* | 8/2013 | Tsai | H01L 21/0337 257/E21.242 |
| 8,525,235 B2 | 9/2013 | Cheng et al. | |
| 8,546,202 B2* | 10/2013 | Tung | H01L 21/3086 438/151 |
| 8,623,770 B1 | 1/2014 | Gao et al. | |
| 8,778,807 B2* | 7/2014 | Lai | H01L 21/0337 257/E21.24 |
| 8,836,083 B2* | 9/2014 | Zhou | H01L 21/0338 257/618 |
| 8,883,644 B2* | 11/2014 | Wells | H01L 21/0337 257/E21.023 |
| 8,900,937 B2* | 12/2014 | Lin | H01L 21/823431 438/157 |
| 8,901,700 B2* | 12/2014 | Parekh | H01L 21/2815 257/244 |
| 8,980,756 B2* | 3/2015 | Tran | H01L 21/0337 438/703 |
| 9,003,651 B2* | 4/2015 | Abatchev | H01L 21/0337 257/E21.206 |
| 9,035,416 B2* | 5/2015 | Fischer | H01L 21/0338 257/499 |
| 9,048,194 B2* | 6/2015 | Zhu | H01L 21/0337 |
| 9,059,001 B2* | 6/2015 | Liu | H01L 29/66795 |
| 2006/0046201 A1* | 3/2006 | Sandhu | H01L 21/0337 430/314 |
| 2006/0046484 A1* | 3/2006 | Abatchev | H01L 21/0332 438/689 |
| 2007/0026684 A1* | 2/2007 | Parascandola | H01L 21/0337 438/733 |
| 2007/0049040 A1* | 3/2007 | Bai | H01L 21/0337 438/712 |
| 2008/0008969 A1* | 1/2008 | Zhou | H01L 21/0337 430/313 |
| 2008/0248429 A1* | 10/2008 | Chou | H01L 21/0337 430/311 |
| 2009/0032963 A1* | 2/2009 | Tran | H01L 21/02164 257/774 |
| 2009/0101995 A1* | 4/2009 | Beintner | H01L 29/7851 257/412 |
| 2009/0233238 A1* | 9/2009 | Hsu | H01L 21/31144 430/312 |
| 2009/0258500 A1* | 10/2009 | Yang | H01L 21/3081 438/703 |
| 2010/0144153 A1* | 6/2010 | Sills | G03F 7/0035 438/696 |
| 2011/0097863 A1* | 4/2011 | Shieh | H01L 21/823431 438/268 |
| 2011/0130006 A1* | 6/2011 | Abatchev | H01L 21/0337 438/703 |
| 2012/0126325 A1* | 5/2012 | Wang | H01L 21/823431 257/365 |
| 2012/0126326 A1* | 5/2012 | Wang | H01L 21/823431 257/365 |
| 2012/0202350 A1* | 8/2012 | Sant | H01L 21/3086 438/703 |
| 2012/0282778 A1* | 11/2012 | Light | H01L 21/0337 438/703 |
| 2013/0154004 A1* | 6/2013 | Liu | H01L 29/66795 257/347 |
| 2013/0157462 A1* | 6/2013 | Lee | H01L 21/0337 438/685 |
| 2013/0171784 A1* | 7/2013 | Tran | H01L 21/0337 438/257 |
| 2013/0217233 A1* | 8/2013 | Chang | H01L 21/3086 438/702 |
| 2013/0244436 A1* | 9/2013 | Sandhu | B82Y 10/00 438/702 |
| 2014/0017894 A1* | 1/2014 | Tsai | H01L 21/76816 438/694 |
| 2015/0111380 A1* | 4/2015 | Chang | H01L 21/0337 438/674 |
| 2015/0155198 A1* | 6/2015 | Tsai | H01L 21/76802 438/674 |
| 2015/0170905 A1* | 6/2015 | Tran | H01L 21/0337 257/618 |
| 2015/0171177 A1* | 6/2015 | Cheng | H01L 29/66795 257/288 |

* cited by examiner

PITCH SPLIT PATTERNING FOR SEMICONDUCTOR DEVICES

BACKGROUND

The present invention generally relates to complimentary metal-oxide semiconductors (CMOS) and metal-oxide-semiconductor field-effect transistors (MOSFET), and more specifically, to finFET device fabrication.

The MOSFET is a transistor used for switching electronic signals. The MOSFET has a source, a drain and a gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET has n-doped source and drain junctions and uses electrons as the current carriers. The pFET has p-doped source and drain junctions and uses holes as the current carriers.

The finFET is a type of MOSFET. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

Gate spacers form an insulating film along the gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming a semiconductor device comprises forming a first hardmask on a semiconductor substrate, forming a sacrificial layer on the first hardmask, and forming a second hardmask on the sacrificial layer. Portions of the second hardmask and the sacrificial layer are removed to form a sacrificial mandrel on the first hardmask. Sacrificial spacers are formed adjacent to the sacrificial mandrel. A second sacrificial layer is formed on exposed portions of the first hardmask and the second hardmask. Portions of the second sacrificial layer are removed to expose portions of the sacrificial spacers and the first hardmask. Dopants are driven from the sacrificial spacers into an adjacent region of the sacrificial mandrel to form a first doped region, and drive dopants from the sacrificial spacers into an adjacent region of the second sacrificial layer to form a second doped region. Removing the second hardmask and the sacrificial spacers to expose a portion of the first hardmask. The undoped portions of the sacrificial mandrel are removed, and the second sacrificial layer is removed to further expose portions of the first hardmask. Exposed portions of the first hardmask are removed to expose portions of the semiconductor substrate. Exposed portions of the semiconductor substrate are removed to form fins. A gate stack is formed over channel regions of the fins.

According to another embodiment of the present invention, a method for forming fins of a semiconductor device comprises forming a first hardmask on a semiconductor substrate, a sacrificial layer on the first hardmask, and a second hardmask on the sacrificial layer. Portions of the second hardmask and the sacrificial layer are removed to form a sacrificial mandrel on the first hardmask. Sacrificial spacers are formed adjacent to the sacrificial mandrel. A second sacrificial layer is formed on exposed portions of the first hardmask and the second hardmask. Portions of the second sacrificial layer are removed to expose portions of the spacers and the first hardmask. Dopants are driven from the sacrificial spacers into an adjacent region of the sacrificial mandrel to form a first doped region, and drive dopants from the sacrificial spacers into an adjacent region of the second sacrificial layer to form a second doped region. The second hardmask and the sacrificial spacers are removed to expose a portion of the first hardmask. The undoped portions of the sacrificial mandrel and the second sacrificial layer are removed to further expose portions of the first hardmask. Exposed portions of the first hardmask are removed to expose portions of the semiconductor substrate, and exposed portions of the semiconductor substrate are removed to form fins.

According to yet another embodiment of the present invention, a method for forming fins of a semiconductor device comprises forming a first hardmask on a semiconductor substrate, a sacrificial layer on the first hardmask, and a second hardmask on the sacrificial layer. Portions of the second hardmask and the sacrificial layer are removed to form a sacrificial mandrel on the first hardmask. Sacrificial spacers that include a silicate material are formed adjacent to the sacrificial mandrel. A second sacrificial layer is formed on exposed portions of the first hardmask and the second hardmask. Portions of the second sacrificial layer are removed to expose portions of the spacers and the first hardmask. Dopants are driven from the sacrificial spacers into an adjacent region of the sacrificial mandrel to form a first doped region, and drive dopants from the sacrificial spacers into an adjacent region of the second sacrificial layer to form a second doped region. The second hardmask and the sacrificial spacers are removed to expose a portion of the first hardmask. The undoped portions of the sacrificial mandrel and the second sacrificial layer are removed to further expose portions of the first hardmask. Exposed portions of the first hardmask are removed to expose portions of the semiconductor substrate, and exposed portions of the semiconductor substrate are removed to form fins.

DETAILED DESCRIPTION

As the scaling of semiconductors continues to become smaller, the formation of semiconductor fins having a desired smaller pitch becomes more challenging. The methods described herein provide for forming semiconductor fins with a pitch split patterning method.

Figure 1:
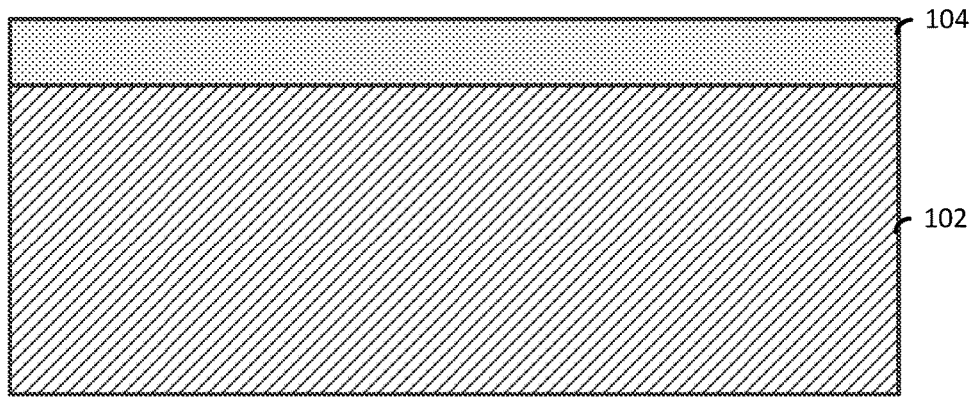
FIG. 1 illustrates a side view of a bulk semiconductor substrate.

FIG. 1 illustrates a side view of a bulk semiconductor substrate 102. The substrate 102 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 102 may also comprise an organic semiconductor or a layered semiconductor such as, for example, Si/SiGe, a silicon-on-insulator or a SiGe-on-insulator. A portion or entire semiconductor substrate 102 may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate 102 may be doped, undoped or contain doped regions and undoped regions therein. The semiconductor substrate may contain regions with strain and regions without strain therein, or contain regions of tensile strain and compressive strain.

A hardmask layer 104 is arranged on the semiconductor substrate 102. The hardmask 104 may include, for example, silicon oxide, silicon nitride (SiN), SiOCN, SiBCN or any suitable combination of those. The hardmask 104 may be deposited using a deposition process, including, but not limited to, PVD, CVD, PECVD, or any combination thereof.

Though the illustrated exemplary embodiment shows a bulk substrate 102, alternate exemplary embodiments may include a semiconductor on insulator (SOI) substrate.

Figure 2:
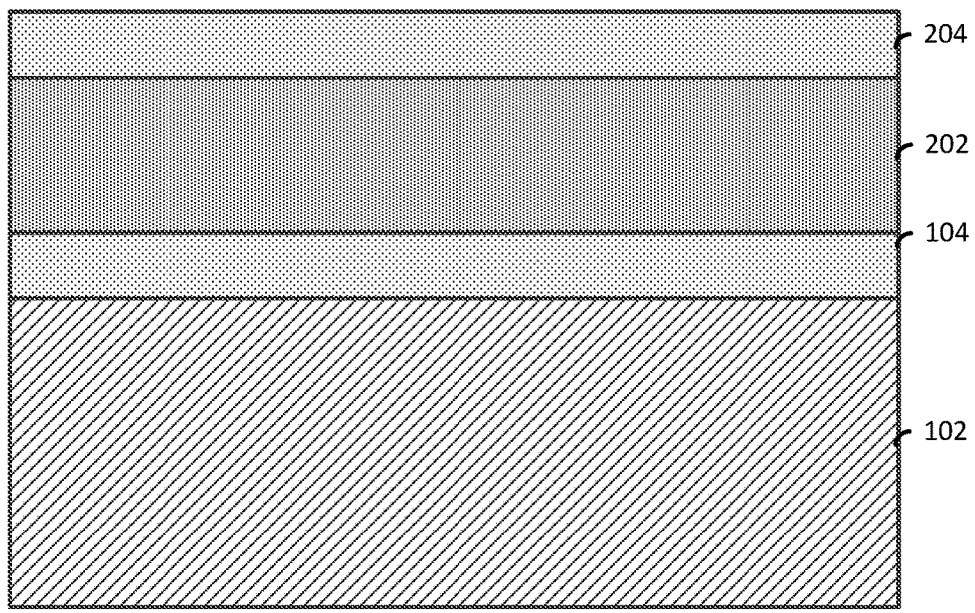
FIG. 2 illustrates a side view following the formation of a sacrificial layer and a second hardmask over the sacrificial layer.

FIG. 2 illustrates a side view following the formation of a sacrificial layer 202 and a second hardmask 204 over the sacrificial layer 202. In the illustrated embodiment, the sacrificial layer 202 includes a semiconductor material such as, for example, amorphous silicon.

Figure 3A:
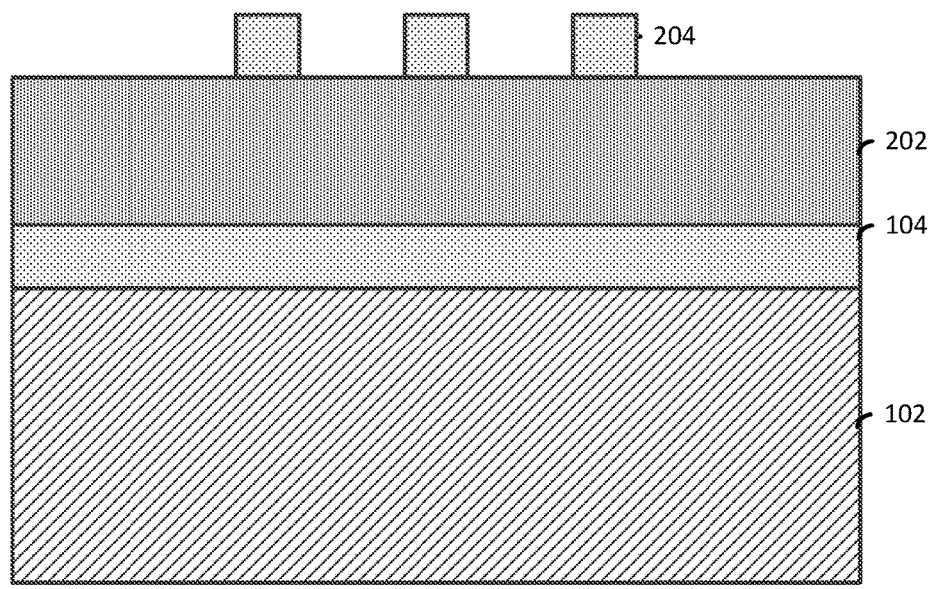
FIG. 3A illustrates a cut-away view along the line A-A (of FIG. 3B) following the patterning of the second hardmask.
Figure 3B:
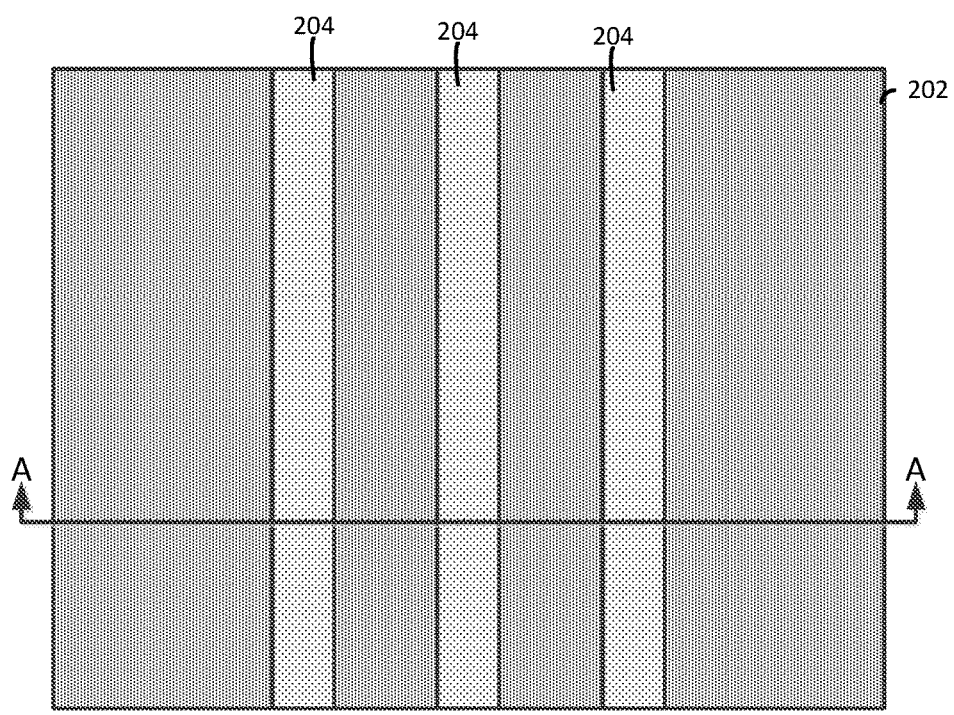
FIG. 3B illustrates a top view of the second hardmask.

FIG. 3A illustrates a cut-away view along the line A-A (of FIG. 3B) following the patterning of the second hardmask 204. The second hardmask may be patterned by, for example, patterning a resist mask (not shown) over the second hardmask 204 and performing an anisotropic etching process such as, for example, reactive ion etching to remove exposed portions of the second hardmask 204 and expose portions of the sacrificial layer 202. FIG. 3B illustrates a top view of the second hardmask 204.

Figure 4:
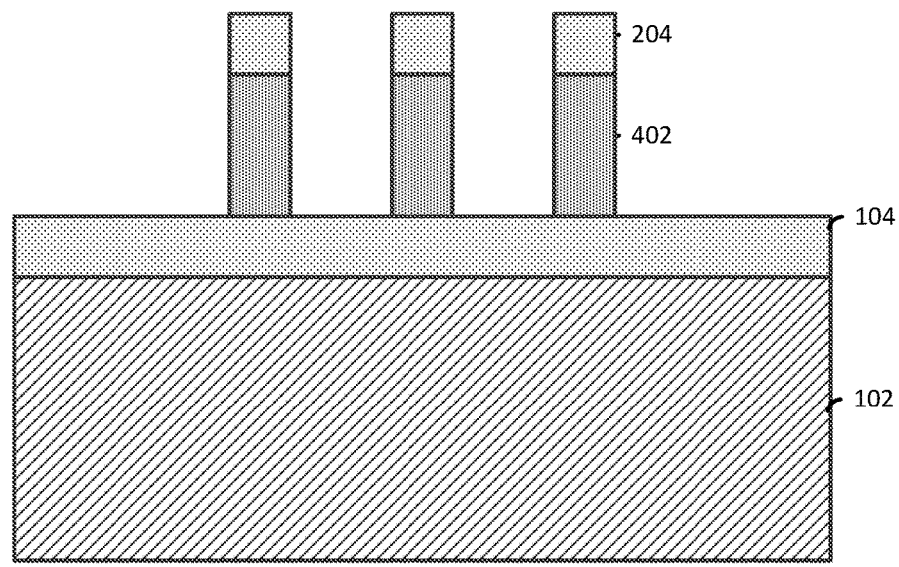
FIG. 4 illustrates a side view following the formation of sacrificial mandrels.

FIG. 4 illustrates a side view following the formation of sacrificial mandrels 404. The sacrificial mandrels are formed by, for example, a selective anisotropic etching process such as, for example, reactive ion etching that removes exposed portions of the sacrificial layer 202 (of FIG. 3) and exposes portions of the hardmask 104.

Figure 5:
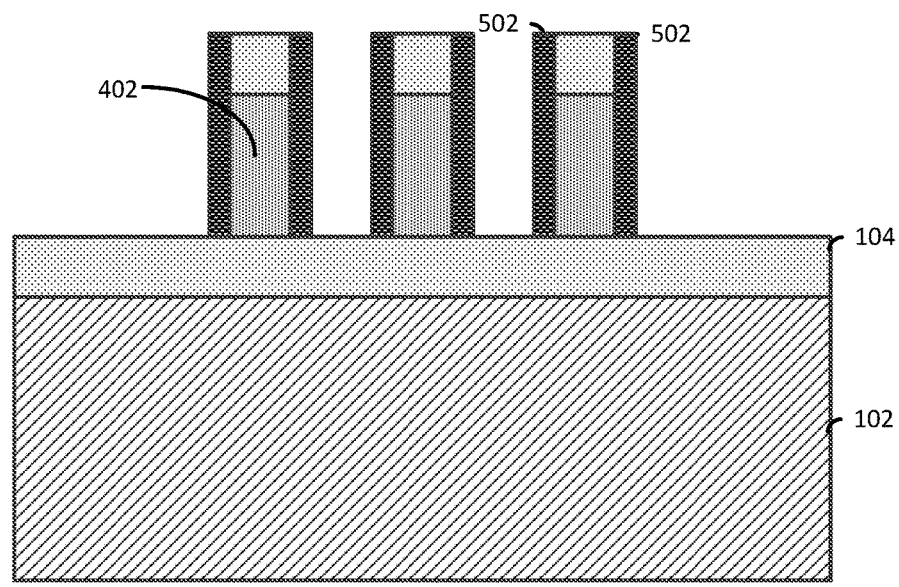
FIG. 5 illustrates a side view of the resultant structure following the formation of sacrificial spacers adjacent to the sacrificial mandrels.

FIG. 5 illustrates a side view of the resultant structure following the formation of sacrificial spacers 502 adjacent to the sacrificial mandrels 404. The sacrificial spacers 502 may include, for example, a phosphosilicate glass (PSG) or borosilicate glass (BSG) film that include dopants.

Figure 6:
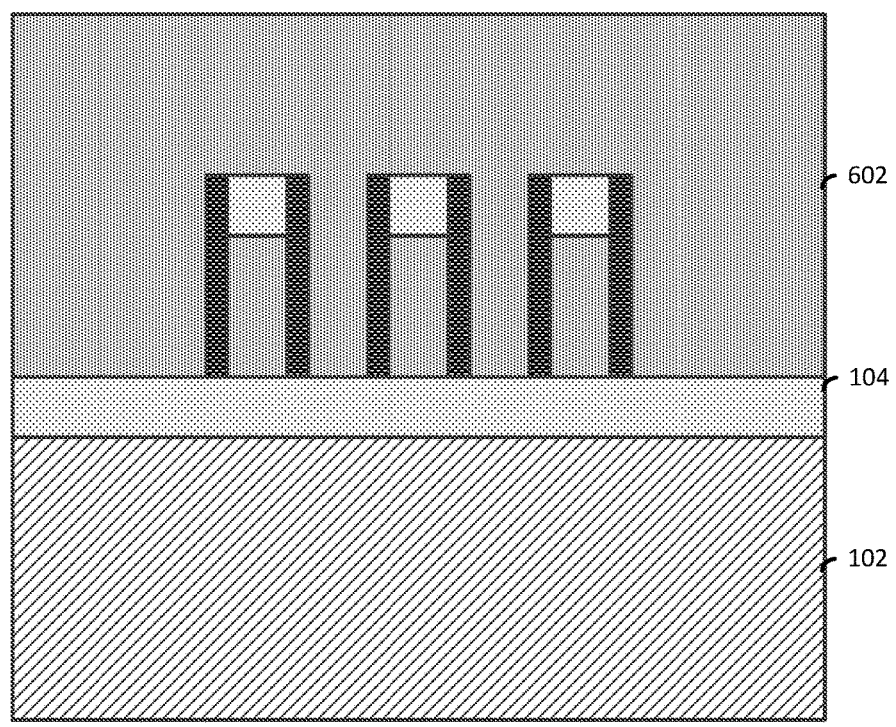
FIG. 6 illustrates a side view following the deposition of a second sacrificial layer over exposed portions of the hardmask, the spacers, and the second hardmask.

FIG. 6 illustrates a side view following the deposition of a second sacrificial layer 602 over exposed portions of the hardmask 104, the spacers 502, and the second hardmask 204. In the illustrated exemplary embodiment, the second sacrificial layer 602 includes an amorphous silicon material.

Figure 7:
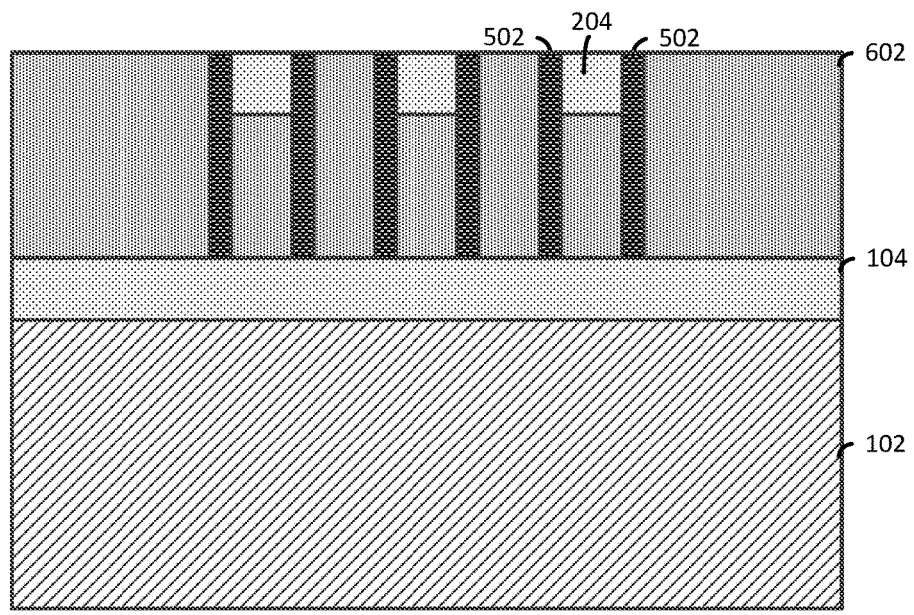
FIG. 7 illustrates a cut-away view following a planarization process that removes portions of the second sacrificial layer to expose portions of the sacrificial spacers and the second hardmask.

FIG. 7 illustrates a cut-away view following a planarization process that removes portions of the second sacrificial layer 602 to expose portions of the sacrificial spacers 502 and the second hardmask 204. The planarization process may include, for example, chemical mechanical polishing.

Figure 8:
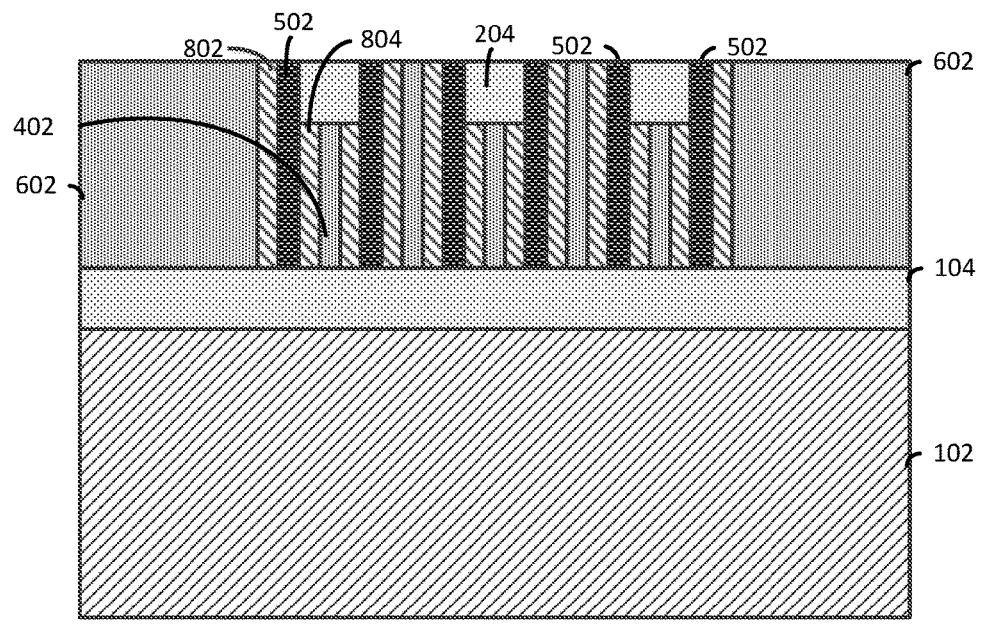
FIG. 8 illustrates a cut-away view following an annealing process that drives dopants from the sacrificial spacers into the adjacent sacrificial mandrels to form doped regions under the second hardmask.

FIG. 8 illustrates a cut-away view following an annealing process that drives dopants from the sacrificial spacers 502 into the adjacent sacrificial mandrels 402 to form doped regions 804 under the second hardmask 204. The annealing process drive dopants from the sacrificial spacers 502 into the adjacent second sacrificial layer 602 to form doped regions 802 adjacent to the sacrificial spacers 502. In the illustrated exemplary embodiment, the sacrificial mandrels 402 and the second sacrificial layer include amorphous silicon, thus the doped regions 802 and 804 include doped amorphous silicon.

Figure 9:
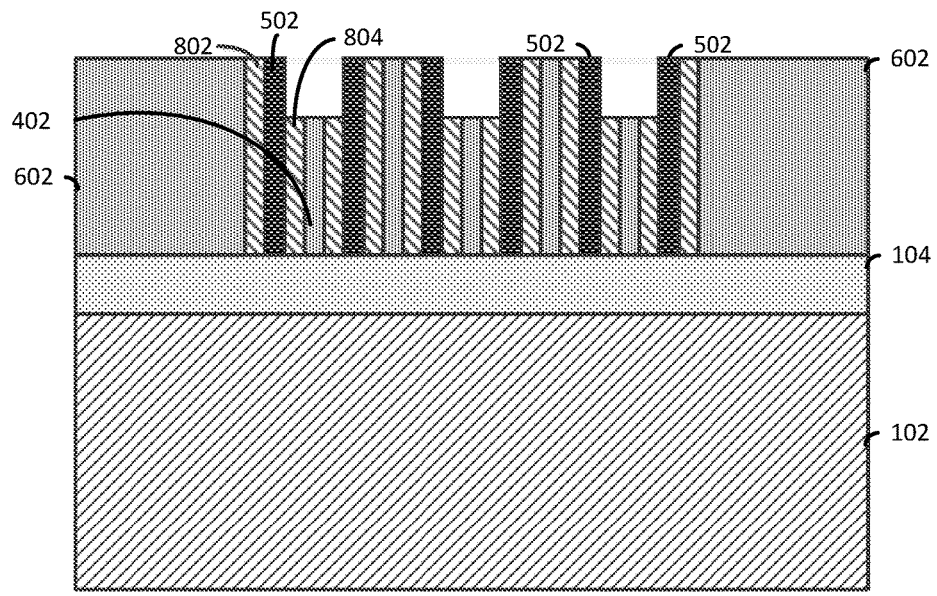
FIG. 9 illustrates a cut-away view of the resultant structure following a selective etching process that removes the second hardmask (of FIG. 8).

FIG. 9 illustrates a cut-away view of the resultant structure following a selective etching process that removes the second hardmask 204 (of FIG. 8). The removal of the second hardmask 204 exposes the doped regions 804 and the sacrificial mandrels 402.

Figure 10:
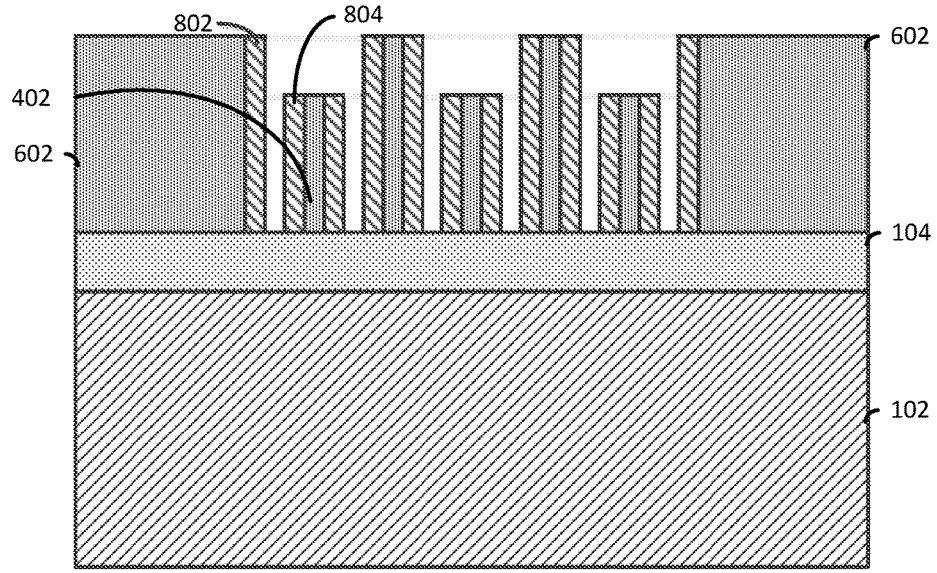
FIG. 10 illustrates a cut-away view following a selective etching process that removes the sacrificial spacers to expose portions of the first hardmask.

FIG. 10 illustrates a cut-away view following a selective etching process that removes the sacrificial spacers 502 to expose portions of the first hardmask 104.

Figure 11:
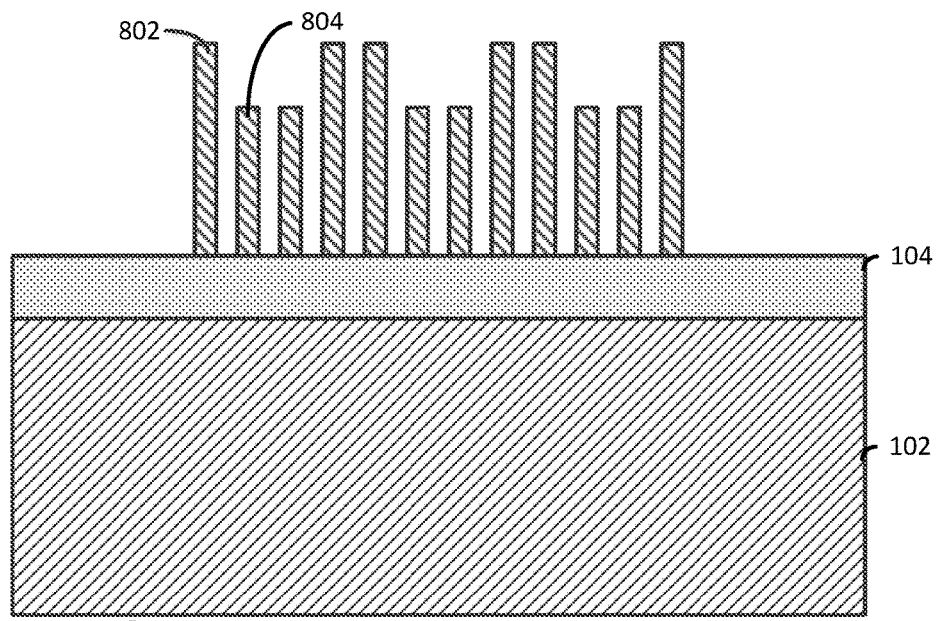
FIG. 11 illustrates a cut-away view following a selective etching process that removes exposed undoped portions of the sacrificial mandrels (of FIG. 10) and the second sacrificial layer.

FIG. 11 illustrates a cut-away view following a selective etching process that removes exposed undoped portions of the sacrificial mandrels 402 (of FIG. 10) and the second sacrificial layer 602. The etching process is selective such that the doped regions 802 and 804 remain substantially non-etched.

Figure 12:
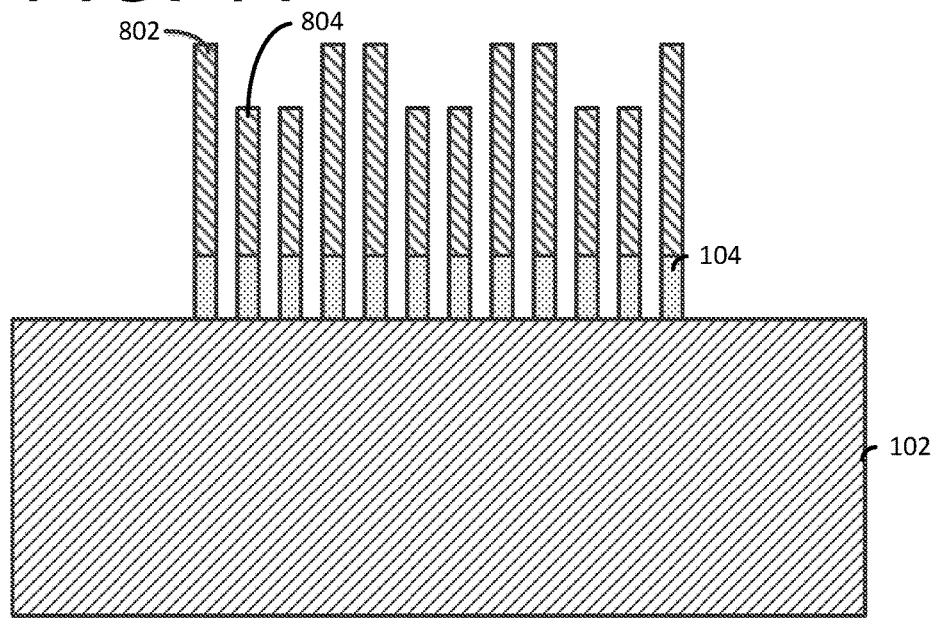
FIG. 12 illustrates a cut-away view following a selective etching process that removes exposed portions of the hardmask to expose portions of the substrate.

FIG. 12 illustrates a cut-away view following a selective etching process that removes exposed portions of the hardmask 104 to expose portions of the substrate 102. The etching process includes an anisotropic selective such that the exposed portions of the hardmask 104 is removed.

Figure 13:
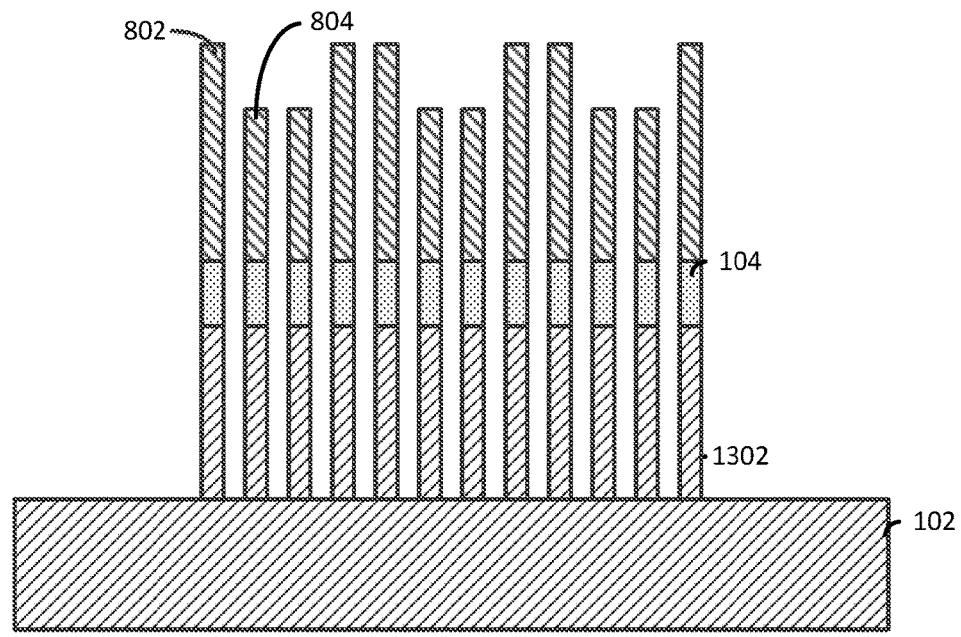
FIG. 13 illustrates a cut-away view following another selective etching process that removes exposed portions of the substrate to form fins on the substrate.

FIG. 13 illustrates a cut-away view following another selective etching process that removes exposed portions of the substrate 102 to form fins 1302 on the substrate 102. The etching process may include a suitable anisotropic etching process such as, for example, reactive ion etching.

Figure 14:
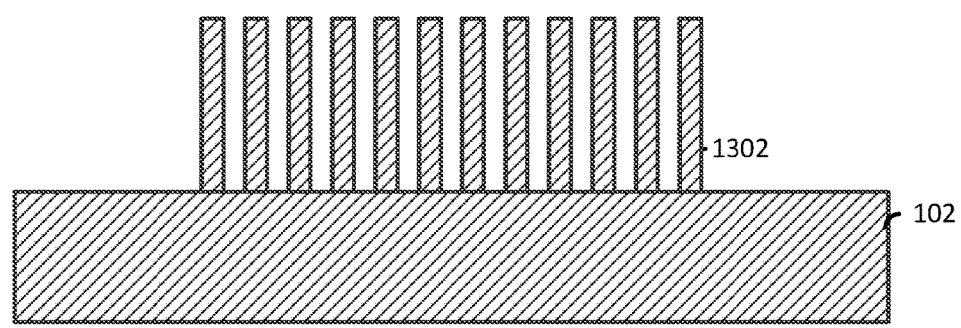
FIG. 14 illustrates a side view following the removal of the hardmask, and the doped regions (of FIG. 13) to expose the fins.

FIG. 14 illustrates a side view following the removal of the hardmask 104, and the doped regions 802 and 804 (of FIG. 13) to expose the fins 1302.

Figure 15:
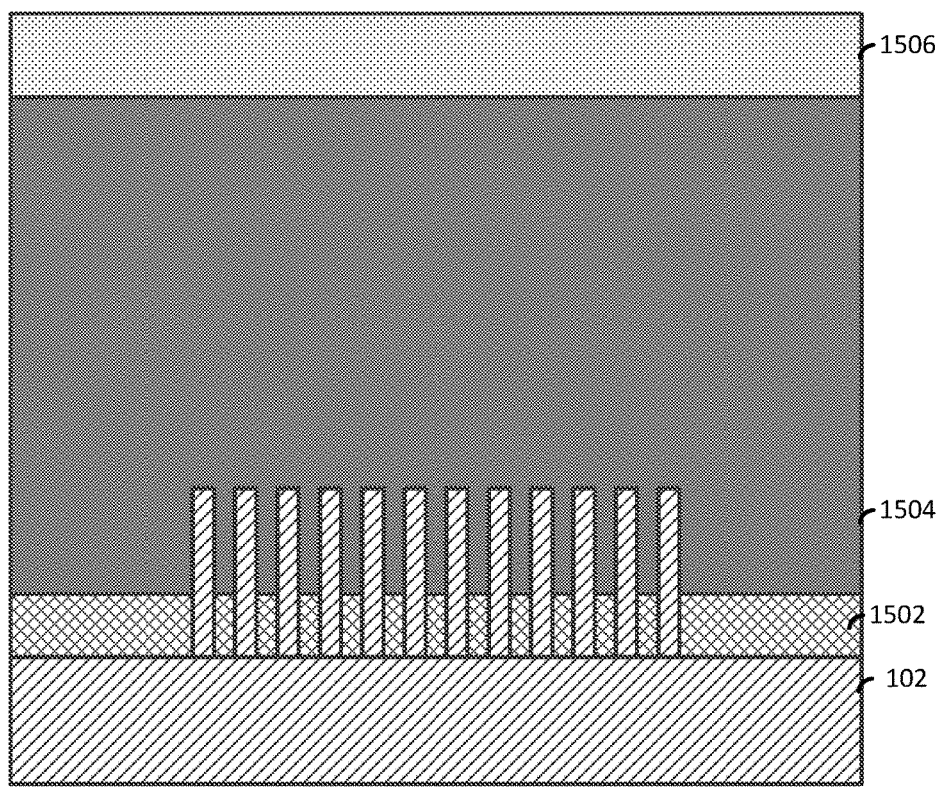
FIG. 15 illustrates a cut-away view following the formation of a shallow trench isolation region, a layer of sacrificial gate material and a hardmask over the layer of sacrificial gate material.

FIG. 15 illustrates a cut-away view following the formation of a shallow trench isolation region 1502, a layer of sacrificial gate material 1504 and a hardmask 1506 over the layer of sacrificial gate material 1504. The shallow trench isolation region 1502 may be formed by, for example, depositing an insulating material, such as silicon dioxide over the substrate 102. In the illustrated embodiment, at least one isolation region is a shallow trench isolation region ("STI"). However, the isolation region 1502 may be a trench isolation region, a field oxide isolation region (not shown), or any other type of isolation region. The isolation region 1502 provides isolation between neighboring gate structure regions, and may be used when the neighboring gates have opposite conductivities, e.g., nFETs and pFETs. As such, the isolation region 1502 separates an nFET device region from a pFET device region.

The layer of sacrificial gate material 1504 may include any suitable material such as, for example, amorphous silicon (aSi), or polycrystalline silicon (polysilicon) material or another suitable sacrificial gate material.

The layer sacrificial gate material may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, the hard mask layer 1506 such as, for example, silicon oxide, silicon nitride (SiN), SiOCN, SiBCN or any suitable combination of those materials, is deposited on the layer of sacrificial gate material. The hardmask layer may be deposited using a deposition process, including, but not limited to, PVD, CVD, PECVD, or any combination thereof.

Figure 16A:
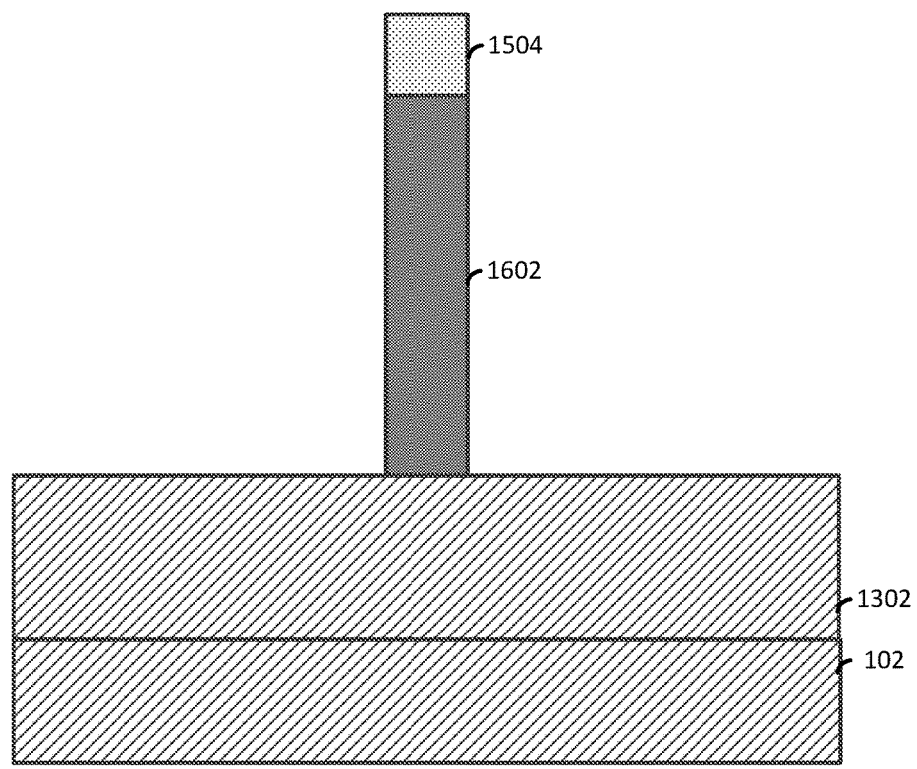
FIG. 16A illustrates a cut-away view along the line B-B (of FIG. 16B) following the formation of a sacrificial gate over a channel region of the fins.
Figure 16B:
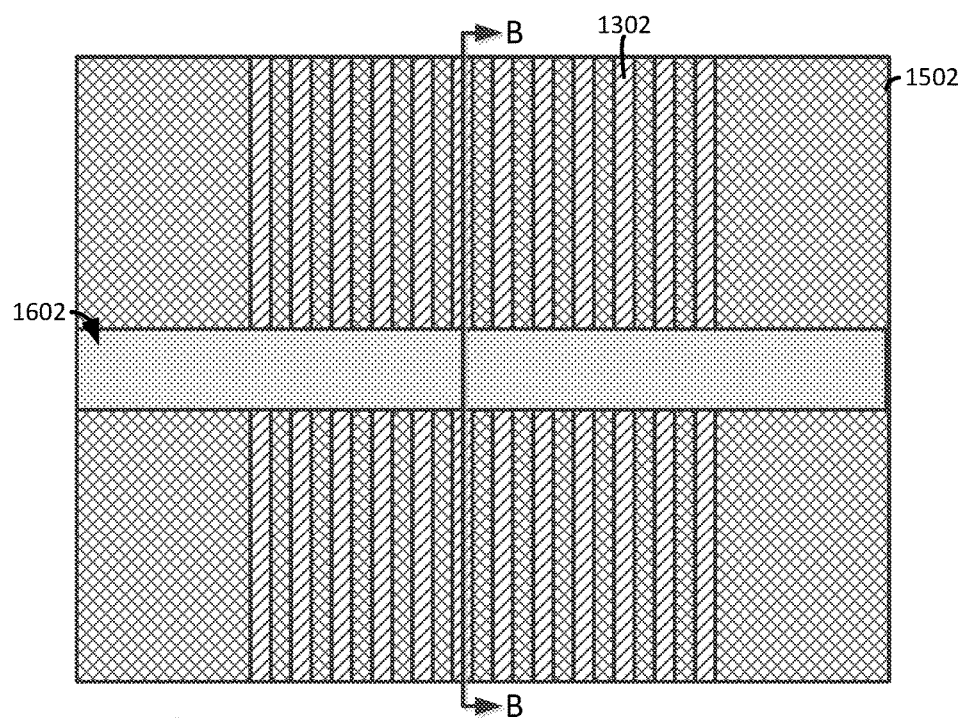
FIG. 16B illustrates a top view of the sacrificial gate.

FIG. 16A illustrates a cut-away view along the line B-B (of FIG. 16B) following the formation of a sacrificial gate 1602 over a channel region of the fins 1302. Following the deposition of the layer sacrificial gate material 1504 (of FIG. 15) and the hardmask layer 1504, a lithographic patterning and etching process such as, for example, reactive ion etching or a wet etching process is performed to remove exposed portions of the hardmask layer and the layer of sacrificial gate material form the sacrificial gate 1602 and the sacrificial gate cap 1504. FIG. 16B illustrates a top view of the sacrificial gate 1602.

Figure 17:
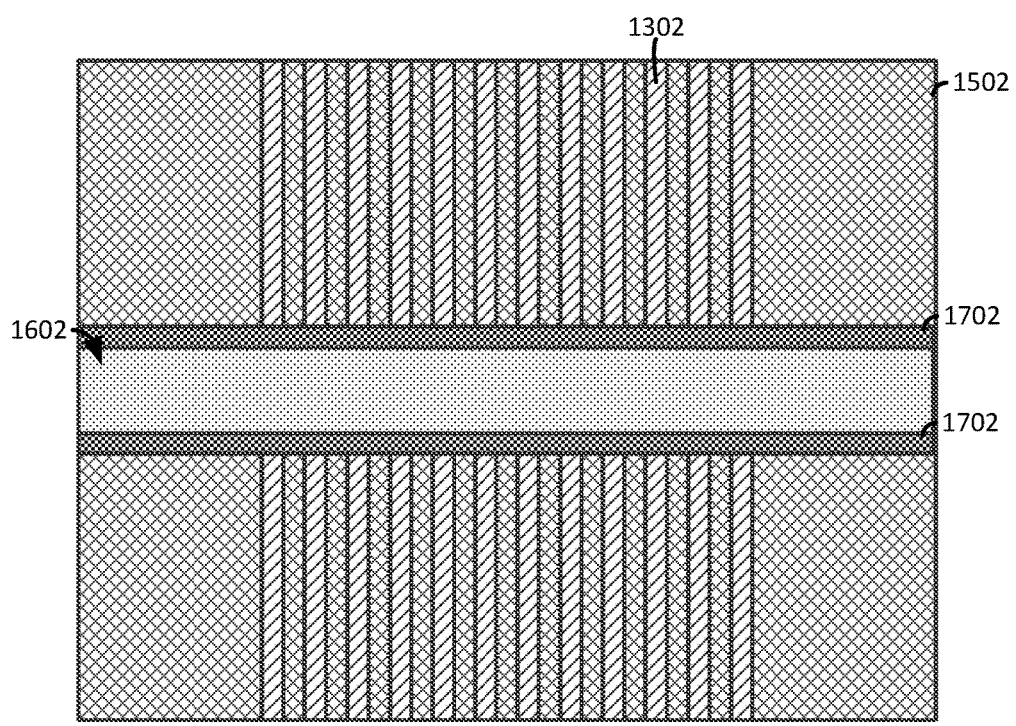
FIG. 17 illustrates a top view following the formation of spacers.

FIG. 17 illustrates a top view following the formation of spacers 1702. The spacers 1702 are formed adjacent to the sacrificial gate 1602. The spacers 1702 in the illustrated embodiment are formed by depositing a layer of spacer material (not shown) over the exposed portions of the SOI layer 1502, the fins 1302, and the sacrificial gate 1602. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 1702.

Figure 18:
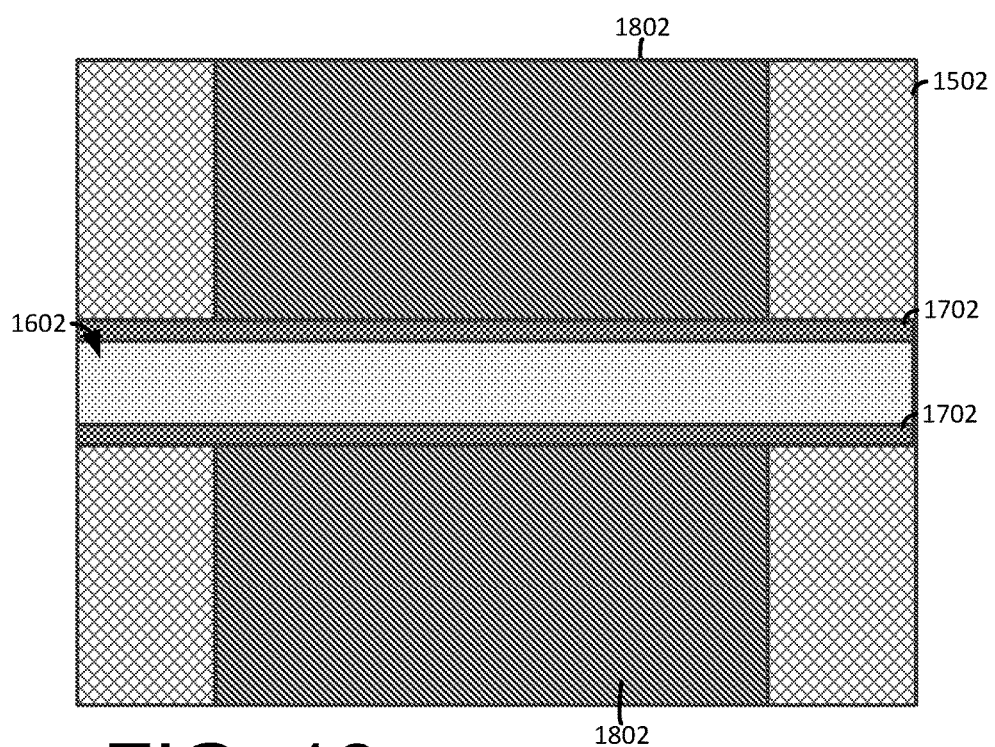
FIG. 18 illustrates a top view following the formation of source/drain regions.

FIG. 18 illustrates a top view following the formation of source/drain regions 1802. The source/drain regions 1802 are formed by an epitaxial growth process that deposits a crystalline overlayer of semiconductor material onto the exposed crystalline seed material of the exposed fins 1302 to form the source/drain regions 1802.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ to $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 19A:
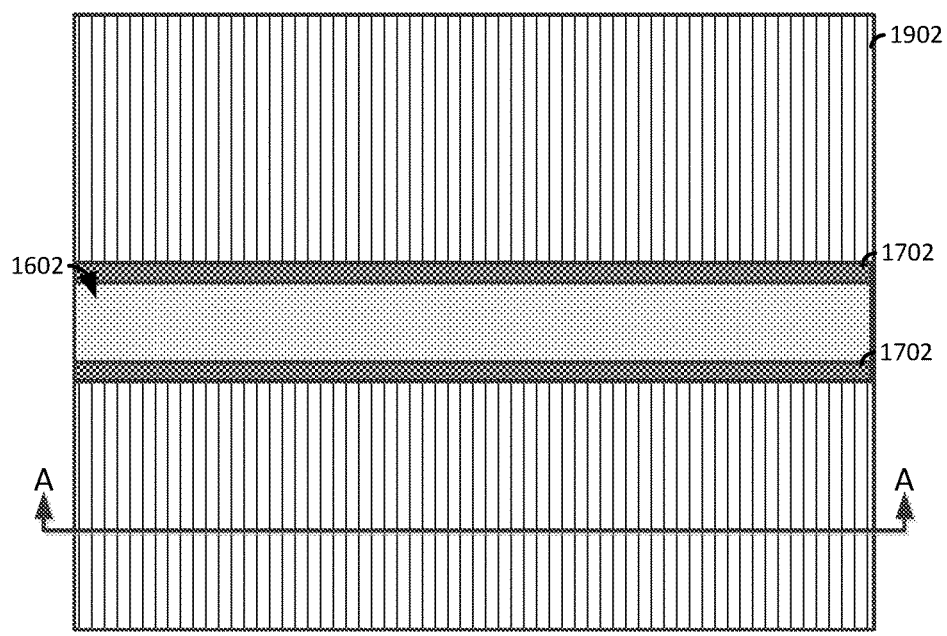
FIG. 19A illustrates a top view following the formation of an inter-level dielectric layer over exposed portions of the source/drain regions and the STI region.
Figure 19B:
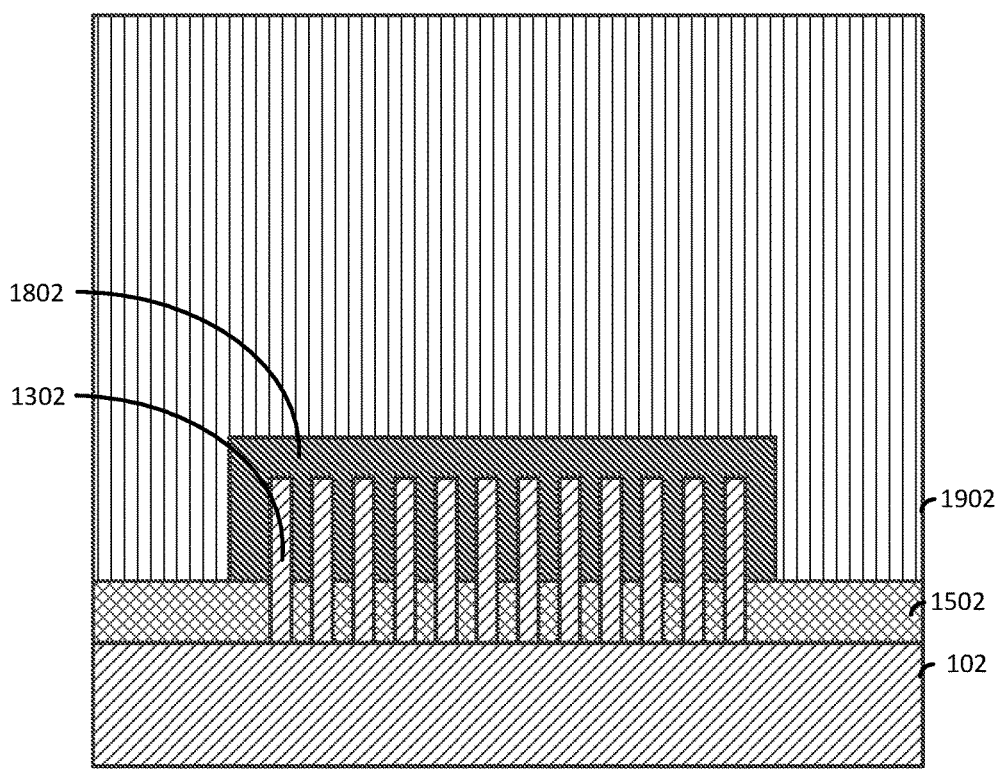
FIG. 19B illustrates a cut-away view along the line A-A (of FIG. 19A).

FIG. 19A illustrates a top view following the formation of an inter-level dielectric layer 1902 over exposed portions of the source/drain regions 1802 and the STI region 1502. The inter-level dielectric layer 1902 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1902 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1902, a planarization process such as, for example, chemical mechanical polishing is performed. FIG. 19B illustrates a cut-away view along the line A-A (of FIG. 19A).

Figure 20:
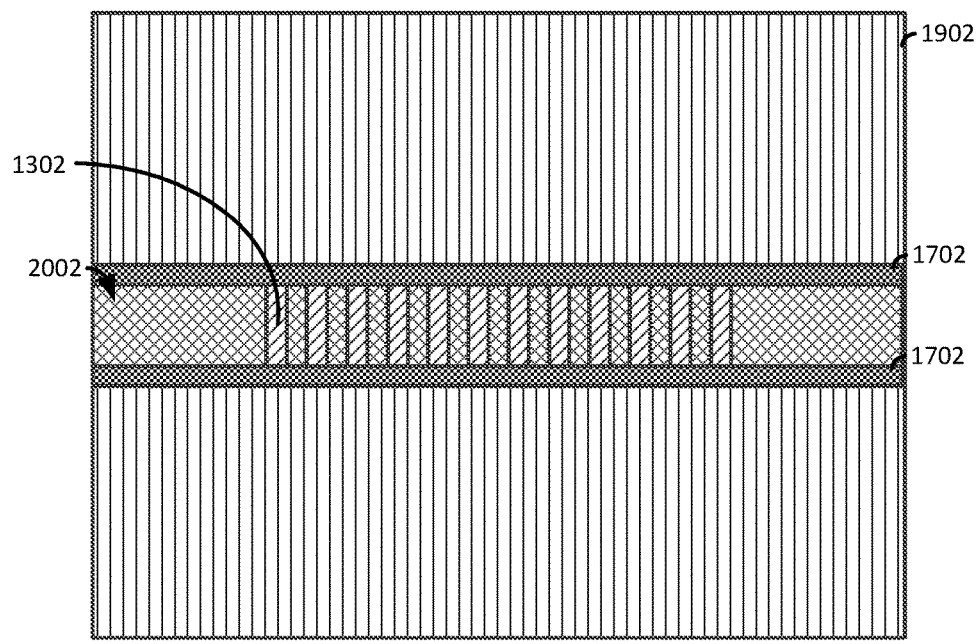
FIG. 20 illustrates a top view following the removal of the sacrificial gate (of FIG. 19A) to form cavity that expose the channel regions of the fins.

FIG. 20 illustrates a top view following the removal of the sacrificial gate 1602 (of FIG. 19A) to form cavity 2002 that expose the channel regions of the fins 1302. The sacrificial gate 1602 may be removed by performing a dry etch process, for example, RIE, followed by a wet etch process. The wet etch process is selective to (will not substantially etch) the spacers 1702 and the inter-level dielectric material. The chemical etch process may include, but is not limited to, hot ammonia or tetramethylammonium hydroxide (TMAH).

Figure 21A:
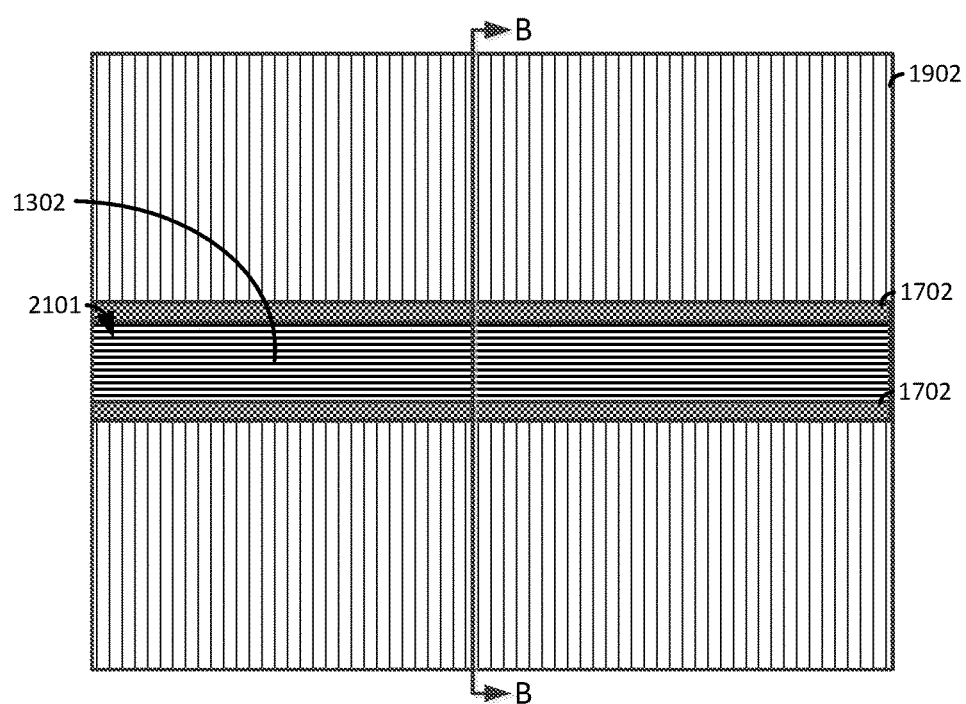
FIG. 21A illustrates a top view of the resultant structure following the formation of a replacement metal gate stack (gate stack).
Figure 21B:
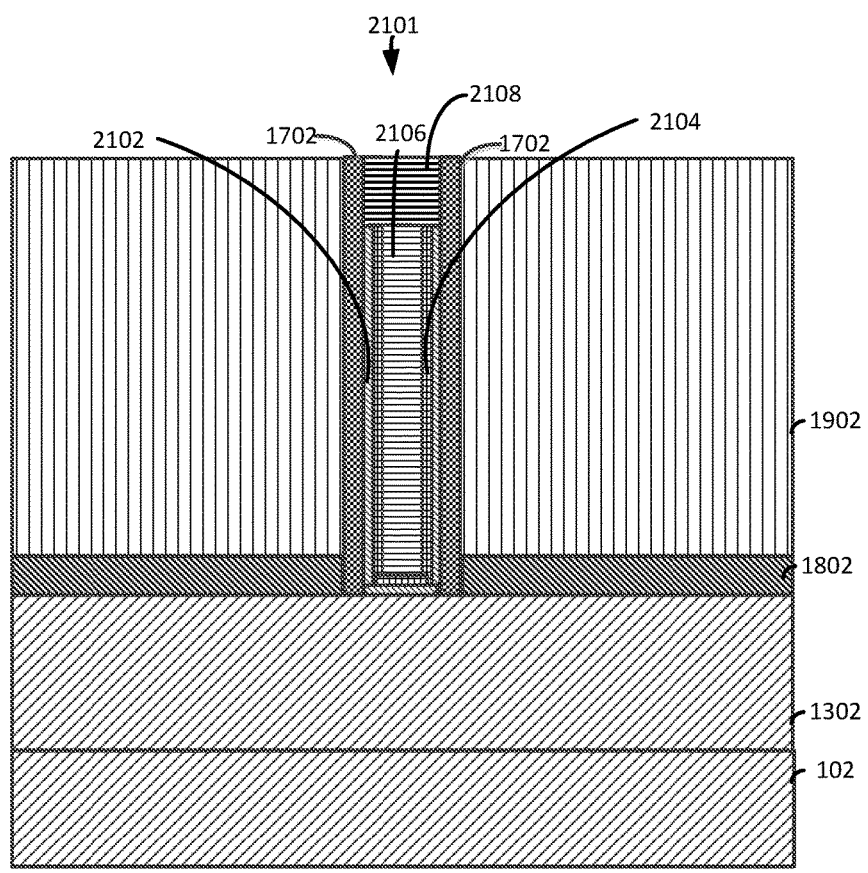
FIG. 21B illustrates a cut-away view along the line B-B (of FIG. 21A) of the gate stack.

FIG. 21A illustrates a top view of the resultant structure following the formation of a replacement metal gate stack (gate stack) 2101. FIG. 21B illustrates a cut-away view along the line B-B (of FIG. 21A) of the gate stack 2101. The gate stack 2101 includes high-k metal gates formed, for example, by filling the cavity 2002 (of FIG. 20) with one or more gate dielectric 2102 materials, one or more workfunction metals 2104, and one or more metal gate conductor 2106 materials. The gate dielectric 2102 material(s) can be a dielectric material having a dielectric constant greater than 3.9, 7.0, or 10.0. Non-limiting examples of suitable materials for the dielectric 2102 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 2102 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 2104 may be disposed over the gate dielectric 2102 material. The type of work function metal(s) 2104 depends on the type of transistor and may differ between the nFET and pFET devices. Non-limiting examples of suitable work function metals 2104 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 2106 material(s) is deposited over the gate dielectric 2102 materials and work function metal(s) 2104 to form the gate stack 2101. Non-limiting examples of suitable conductive metals include aluminum (Al), platinum (Pt), gold (Au), tungsten (W), titanium (Ti), or any combination thereof. The gate conductor 2106 material(s) may be deposited by a suitable deposition process, for example, CVD, PECVD, PVD, plating, thermal or e-beam evaporation, and sputtering.

Following the deposition of the gate dielectric 2102 materials, the work function metal(s) 2104, and the gate conductor 2106 material(s), planarization process, for example, chemical mechanical planarization (CMP), is performed to remove the overburden of the deposited gate materials and form the gate stack 2101. A gate cap 2108 is formed over the gate stack 2101.

After the gate stack 2101 is formed, additional insulating material (not shown) may be deposited over the device(s). The insulating material may be patterned to form cavities (not shown) that expose portions of the source/drain region 1802 and the gate stack 2101. The cavities may be filled by a conductive material (not shown) and, in some embodiments, a liner layer (not shown) to form conductive contacts (not shown).

The methods described herein provide for forming semiconductor fins having a high pitch using a pitch split patterning process. The semiconductor fins are used to form semiconductor devices.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
    forming a first hardmask on a semiconductor substrate;
    forming a sacrificial layer on the first hardmask;
    forming a second hardmask on the sacrificial layer;
    removing portions of the second hardmask and the sacrificial layer to form a sacrificial mandrel on the first hardmask;
    forming sacrificial spacers adjacent to the sacrificial mandrel;
    doping the sacrificial spacers adjacent to the sacrificial mandrel with a dopant;
    forming a second sacrificial layer on exposed portions of the first hardmask and the second hardmask;
    removing portions of the second sacrificial layer to expose portions of the sacrificial spacers and the first hardmask;
    annealing to drive the dopant from the sacrificial spacers into an adjacent region of the sacrificial mandrel underlying a portion of the second hardmask to form a first doped region and into an adjacent region of the second sacrificial layer to form a second doped region;
    removing the second hardmask;
    removing the sacrificial spacers to expose a portion of the first hardmask;
    removing undoped portions of the sacrificial mandrel and the second sacrificial layer to further expose portions of the first hardmask;
    removing exposed portions of the first hardmask to expose portions of the semiconductor substrate;
    removing exposed portions of the semiconductor substrate to form fins; and
    forming a gate stack over channel regions of the fins.

2. The method of claim 1, further comprising removing the first doped region, the second doped region, and the first hardmask after forming the fins.

3. The method of claim 1, further comprising forming an insulator layer on the substrate adjacent to the fins prior to forming the gate stack.

4. The method of claim 1, wherein the sacrificial spacers include dopants.

5. The method of claim 1, wherein the sacrificial spacers include a silicate glass material.

6. The method of claim 1, further comprising forming a sacrificial gate stack over the channel regions of the fins.

7. The method of claim 1, wherein the annealing process heats the sacrificial spacers to drive the dopants.

8. The method of claim 6, further comprising forming spacers adjacent to the sacrificial gate.

9. The method of claim 8, further comprising forming a source/drain region over exposed portions of the fin.

10. The method of claim 9, further comprising forming an inter-level dielectric layer over the source/drain region.

11. The method of claim 10, further comprising removing the sacrificial gate to expose the channel regions of the fins.

12. A method for forming fins of a semiconductor device, the method comprising:
    forming a first hardmask on a semiconductor substrate;
    forming a sacrificial layer on the first hardmask;
    forming a second hardmask on the sacrificial layer;
    removing portions of the second hardmask and the sacrificial layer to form a sacrificial mandrel on the first hardmask;
    forming sacrificial spacers adjacent to the sacrificial mandrel;
    doping the sacrificial spacers adjacent to the sacrificial mandrel with a dopant
    forming a second sacrificial layer on exposed portions of the first hardmask and the second hardmask;
    planarizing the second sacrificial layer to expose portions of the sacrificial spacers and the first hardmask;
    annealing to drive the dopant from the sacrificial spacers into an adjacent region of the sacrificial mandrel underlying a portion of the second hardmask to form a first doped region and into an adjacent region of the second sacrificial layer to form a second doped region;
    removing the second hardmask;
    removing the sacrificial spacers to expose a portion of the first hardmask;

removing undoped portions of the sacrificial mandrel and the second sacrificial layer to further expose portions of the first hardmask;

removing exposed portions of the first hardmask to expose portions of the semiconductor substrate; and removing exposed portions of the semiconductor substrate to form fins.

13. The method of claim 12, further comprising removing the first doped region, the second doped region, and the first hardmask after forming the fins.

14. The method of claim 12, wherein the sacrificial spacers include dopants.

15. The method of claim 12, wherein the sacrificial spacers include a silicate glass material.

16. The method of claim 12, further comprising forming a sacrificial gate stack over the channel regions of the fins.

17. The method of claim 16, further comprising forming an insulator layer on the substrate adjacent to the fins prior to forming the sacrificial gate stack.

18. The method of claim 17, further comprising:
forming spacers adjacent to the sacrificial gate;
forming a source/drain region over exposed portions of the fin;
forming an inter-level dielectric layer over the source/drain region;
removing the sacrificial gate to expose the channel regions of the fins; and
forming a gate stack over the channel regions of the fins.

19. A method for forming fins of a semiconductor device, the method comprising:
forming a first hardmask on a semiconductor substrate;
forming a sacrificial layer on the first hardmask;
forming a second hardmask on the sacrificial layer;
removing portions of the second hardmask and the sacrificial layer to form a sacrificial mandrel on the first hardmask;
forming sacrificial spacers that include a silicate material adjacent to the sacrificial mandrel;
doping the sacrificial spacers adjacent to the sacrificial mandrel with a dopant
forming a second sacrificial layer on exposed portions of the first hardmask and the second hardmask;
removing portions of the second sacrificial layer to expose portions of the spacers and the first hardmask;
annealing to drive the dopant from the sacrificial spacers into an adjacent region of the sacrificial mandrel underlying a portion of the second hardmask to form a first doped region, and into an adjacent region of the second sacrificial layer to form a second doped region;
removing the second hardmask;
removing the sacrificial spacers to expose a portion of the first hardmask;
removing undoped portions of the sacrificial mandrel and the second sacrificial layer to further expose portions of the first hardmask;
removing exposed portions of the first hardmask to expose portions of the semiconductor substrate; and
removing exposed portions of the semiconductor substrate to form fins.

20. The method of claim 19, wherein the silicate material includes borosilicate.

* * * * *